United States Patent [19]
Wu

[11] Patent Number: 6,125,072
[45] Date of Patent: Sep. 26, 2000

[54] METHOD AND APPARATUS FOR CONTIGUOUSLY ADDRESSING A MEMORY SYSTEM HAVING VERTICALLY EXPANDED MULTIPLE MEMORY ARRAYS

[75] Inventor: Frank Y. Wu, Fremont, Calif.

[73] Assignee: Seagate Technology, Inc., Scotts Valley, Calif.

[21] Appl. No.: 09/357,690

[22] Filed: Jul. 20, 1999

Related U.S. Application Data

[60] Provisional application No. 60/093,741, Jul. 21, 1998.

[51] Int. Cl.$^7$ ........................................... G11C 8/00
[52] U.S. Cl. ............................... 365/230.03; 365/230.01
[58] Field of Search ........................... 365/230.03, 230.01

[56] References Cited

U.S. PATENT DOCUMENTS

| | | | |
|---|---|---|---|
| 3,840,863 | 10/1974 | Fuqua et al. | 340/172.5 |
| 5,361,339 | 11/1994 | Kadakia et al. | 395/400 |
| 5,379,264 | 1/1995 | Kobayashi et al. | 365/230 |
| 5,561,777 | 10/1996 | Kao et al. | 395/405 |
| 5,761,694 | 6/1998 | Rao | 711/5 |
| 5,924,111 | 7/1999 | Huang et al. | 711/5 |

*Primary Examiner*—David Nelms
*Assistant Examiner*—M. Tran
*Attorney, Agent, or Firm*—Flehr Hohbach Test Albritton & Herbert LLP

[57] ABSTRACT

A memory system and a manner of operating the memory system are provided. The memory system includes several arrays arranged in groups of columns having a column address, and rows having a row address. Operating the system involves storing blocks of data in the arrays in a way that provides contiguous logical addresses for the blocks of data. A block of data is stored in a row of a group of columns in an array. The row address is incremented and the process repeated until a row limit is reached. Next, the process is repeated with another array until blocks of data have been stored in all rows of a corresponding group of columns in the array. The column address is incremented and the row address reset, and the process repeated until a column limit is reached.

20 Claims, 5 Drawing Sheets

METHOD AND APPARATUS FOR CONTIGUOUSLY ADDRESSING A MEMORY SYSTEM HAVING VERTICALLY EXPANDED MULTIPLE MEMORY ARRAYS

CROSS REFERENCE TO RELATED APPLICATIONS

This application claims priority to U.S. Provisional Patent Application Ser. No. 60/093,741 filed Jul. 21, 1998.

FIELD OF THE INVENTION

This invention pertains generally to the field of computer memory systems, and more particularly to buffer memory systems for disc drive controllers.

BACKGROUND OF THE INVENTION

Buffer memory systems are commonly used as an interface to couple a host computer and a mass storage device such as a disc drive. One difficulty with such an interface is that data passed to or from the mass storage device is in a serial format, for example data passed to or from a read/write head of a disc drive, while within the computer it is passed along a parallel data bus. Another difficulty is that the computer processes data much more rapidly than the mass storage device is able to store or retrieve it. Thus, the buffer memory system must convert data from a parallel to a serial format and must match the rate with which the data is written to or read from the mass storage device to the much greater rate of the computer by temporarily storing data being transferred between the computer and the mass storage device. A typical buffer memory system includes a buffer memory for temporarily storing data, and a controller for translating or mapping blocks of data from logical block addresses used by a central processing unit (CPU) in the computer to corresponding physical addresses in the buffer memory. The buffer memory generally includes one or more data storage devices, such as random access memories or memory chips (RAM chips). RAM chips are integrated circuit memory chips that have an array of memory cells arranged in rows and columns. FIG. 1 diagrammatically illustrates a conventional buffer memory having a pair of arrays 100, 105 each having 256 column addresses by 4096 row addresses. The column addresses are further divided into 16 groups of 16 columns each to enable data to be stored in blocks of data known as paragraphs consisting of 16 words of 16 bits each. For example, a first paragraph (PARA 0) 106 having a logical address of 0, is mapped to a first row (row 0), in a first group of columns (columns 0 through 15), a second paragraph (PARA 1) 107 is mapped to row 1 of columns 0 through 15, and so on. After the last row in the first group of columns has been reached, for example, after the 4096$^{th}$ paragraph (PARA 4095) 108 has been mapped to row 4095, the row address loops back to row 0 and the column address is incremented to the second group of columns, that is to columns 16 through 31.

Generally, the controller also includes a scheme for checking the integrity of data stored and recovered from the disc drive. In one such scheme, a bit-wise EXCLUSIVE-OR (XOR) operation is performed on each word in a paragraph of data received from the computer. The result of this XOR operation, known as a parity word, is appended to the paragraph stored in the buffer memory and is then transferred to the mass storage device. When a previously stored paragraph of data is recovered from the mass storage device the XOR operation is repeated and the result compared with the stored parity word. If the result is the same, then the recovered data is presumed to be valid, if not an error correcting routine can be invoked to identify and correct the erroneous bit or bits. One problem with this data integrity scheme is that because the parity word occupies a physical address in the RAM chip it renders the corresponding logical address unavailable for addressing data, thus resulting in noncontiguous logical addresses for sequential blocks of data. This is undesirable, since non-contiguous logical addresses increase the time, measured by the number of cycles of a computer's clock, necessary for the computer's CPU to advance from one logical address to the next noncontiguous logical address, thereby impeding operation of the CPU. Also, noncontiguous logical addresses complicate the mapping process, reducing the bandwidth of the buffer memory system. The term bandwidth is commonly used in the field of computer memory to denominate how much information can be transferred to or from the buffer memory in given period.

One partial solution, shown in FIG. 1 uses a scheme known as longitudinal redundancy code (LRC). As with the data integrity scheme described earlier a bit-wise XOR operation is performed on each word in a paragraph to generate a parity word for the paragraph, known here as a LRC-word. However, unlike in the earlier data integrity scheme, the LRC-word is not appended to the paragraph, but is stored separately in the last group of columns, i.e., columns 241 to 256, which are reserved exclusively for parity information. Preferably, the LRC-word for a paragraph is stored in the same row to reduce command overhead, which is the processing time needed by the controller to execute an instruction. Reducing command overhead increases the available bandwidth of the system for useful tasks. Storing the LRC-word in the same row saves the time needed to move from one row address to another, typically about seven clock cycles. An exemplary process for carrying out this scheme will be described with reference to FIG. 1. Beginning with column 241, the column address for a LRC-word is incremented for each paragraph in the same row. For example, the LRC-word for the first paragraph 106 is stored at row 0, column 241, while the LRC-word for the second paragraph 107 is stored at row 1, column 241, and the LRC-word for a 4097$^{th}$ paragraph 109 is stored at row 0, column 242. Thus, the LRC-words are moved to the top end of the range of logical addresses, leaving a contiguous block of logical addresses available for addressing data.

The above approach works adequately for buffer memory systems having a single temporary storage device, such as a single RAM chip. However, a rapid increase in recent years in both the size of computer programs and in the data manipulated by them has led to the development of higher capacity mass storage devices. This in turn has created a demand for faster buffer memory systems having more buffer memory, to interface with them. Traditionally, increasing buffer memory has been accomplished by either increasing the capacity of the RAM chips or by adding more RAM chips to the buffer memory. Unfortunately, neither of these solutions is completely satisfactory. The first is unsatisfactory because the cost of RAM rises dramatically with increasing capacity, and in the highly competitive computer memory market it is undesirable to use more expensive, higher capacity RAM.

Similarly, a problem with the second solution i.e., adding more RAM chips, is that the relatively inexpensive, unsophisticated controllers used in conventional buffer memory systems generally limit the number of RAM chips that can be addressed by a single controller to one or two. Another problem with increasing the number of RAM chips is that for buffer memory systems using the data integrity scheme described above, in which all rows of the last group of columns are reserved for LRC-words, adding more RAM chips reintroduces noncontiguous logical addresses when crossing the chip boundary. By crossing the chip boundary it is meant the transition from the last physical address available for data on a first RAM chip to the first available physical address on a second RAM chip. Because all the rows in columns 241 to 256 of the first RAM 10 are reserved for LRC-words in moving to the second RAM 15, the controller must skip over the logical addresses corresponding to the physical addresses of these areas, resulting in noncontiguous logical addresses for sequential blocks of data.

Accordingly, there is a need for a faster buffer memory system with more buffer memory. There is also a need for a buffer memory system that provides contiguous logical addresses for sequential blocks of data mapped to different temporary storage devices, such as a number of RAM chips. There is a further need for a buffer memory system that includes a scheme for checking the integrity of data stored and recovered from a mass storage device. There is a still further need for a buffer memory system that includes an addressing and a data integrity scheme that increases the bandwidth of the buffer memory system. Finally, to be commercially feasible, it is desirable that the increase in buffer memory should be realizable with less expensive, smaller capacity RAM chips and with existing controllers.

The present invention provides a solution to these and other problems, and offers other advantages over the prior art.

SUMMARY OF THE INVENTION

The present invention relates to a memory system and a manner of operating the system that solves these problems. The memory system includes several arrays arranged in groups of columns having a column address, and rows having a row address. The manner of operating the system involves storing blocks of data in the arrays in a way that provides contiguous logical addresses for the blocks of data. A block of data is stored in a row of a group of columns in an array. Next, the row address is incremented and the process repeated until a row limit is reached. After the row limit has been reached, the process is repeated with another array until blocks of data have been stored in all rows of a corresponding group of columns in the array. The column address is incremented and the row address reset, and the process repeated until a column limit is reached. Preferably, the manner of operating the system also includes generating a parity word for each block of data to check the integrity of data recovered from the arrays. More preferably, the procedure includes reserving all rows in a last group of columns in an array for parity words generated for blocks of data stored in the array, thereby shifting the logical addresses associated with the physical addresses of the parity words to a top end of the range of logical addresses.

In one embodiment, the invention is directed to a manner of operating a disc drive having a buffer memory system including several arrays capable of storing data. The arrays are divided into rows and groups of columns, each row of a group of columns having a physical address. The data is divided into blocks of a predetermined size, the physical addresses of the rows and groups of columns are associated with logical addresses so that (i) a first block of data is stored in a last row of a group of columns in a first array, and (ii) a second block of data having a logical address contiguous to that of the first block of data is stored in a first row of a corresponding group of columns in a second array. Optionally, a third block of data is stored in a last row of the corresponding group of columns in the second array, and storing a fourth block of data having a logical address contiguous to that of the third block of data in a first row of a second group of columns of the first array.

In another aspect the present invention is directed to a memory system having several arrays capable of storing data. Each of the arrays are divided into cells identified by a range of physical addresses. A controller associates logical addresses with the physical addresses and accesses the cells. The controller is adapted to associate physical addresses for cells in different arrays with contiguous logical addresses. Preferably, the controller includes several outputs, each of which represent one bit of a binary number. The outputs are coupled to the arrays so that furnishing a binary number representing a logical address on the outputs accesses a cell having the corresponding physical address. More preferably, the outputs include at least one output for selecting one of the arrays.

The memory system is particularly useful for a data storage system having a data storage device for storing data. The data storage device can be a magnetic disc drive, an optical disc drive, or a magneto-optical disc drive.

These and various other features as well as advantages which characterize the present invention will be apparent upon reading of the following detailed description and review of the associated drawings.

DETAILED DESCRIPTION

Figure 1:
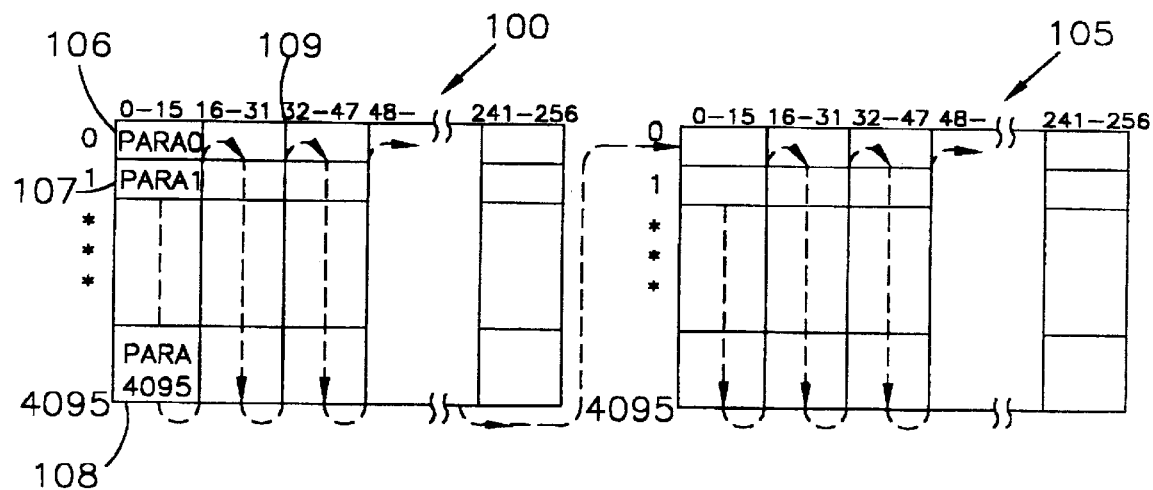
FIG. 1 is a diagram of a conventional buffer memory having two memory arrays.
Figure 2:
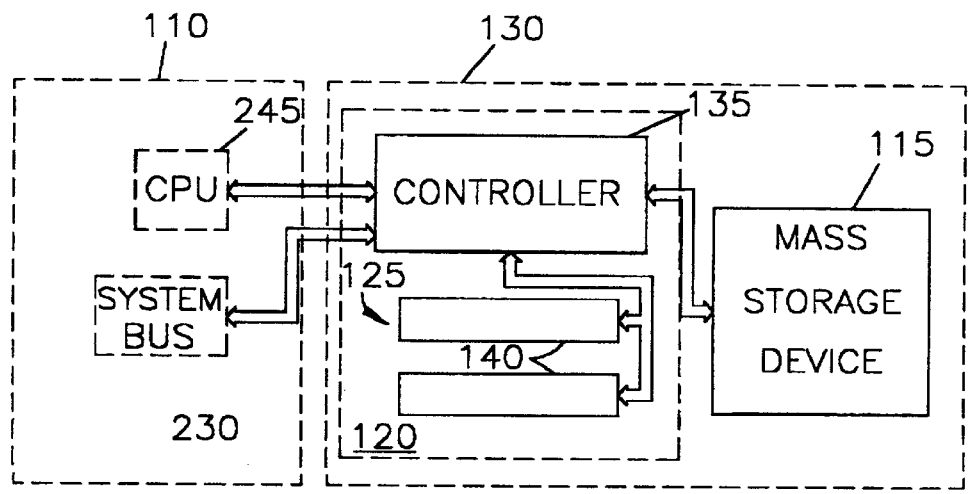
FIG. 2 is a block diagram of a computer coupled to a mass storage device by a buffer memory system according to an embodiment of the present invention.

FIG. 2 shows a block diagram of a host computer 110 coupled to a mass storage device 115, such as an optical, magneto-optical or magnetic disc drive, by a buffer memory system 120. The buffer memory system 120 can be part of the computer 110 or the mass storage device 115, or it can be a discrete assembly enclosed in a separate housing. Generally, as shown in FIG. 2 the buffer memory system 120 is enclosed in a common housing 130 with the mass storage device 115. The buffer memory system 120 includes a buffer memory 125 for temporarily storing data being transferred to or from the mass storage device 115, and a controller 135 for translating or mapping the data from logical addresses to physical addresses in the buffer memory 125.

The buffer memory 125 includes a plurality of temporary data storage devices 140, such as random access memories or memory chips (RAM chips). RAM chips are integrated circuit memory chips that have an array of memory cells for storing data arranged in rows and columns, each memory cell capable of being identified by a unique physical address including a row and column number. There are several types of RAM chips that are suitable for use with the present invention, including but not limited to, dynamic random access memory (DRAM) type I, fast page mode DRAM also known as DRAM type II, synchronous DRAM (SDRAM), extended data out DRAM (EDO DRAM), and static random access memory (SRAM). Of these SDRAM is preferred because it is faster than either type of DRAM and EDO DRAM, and is less expensive than SRAM.

Figure 3:
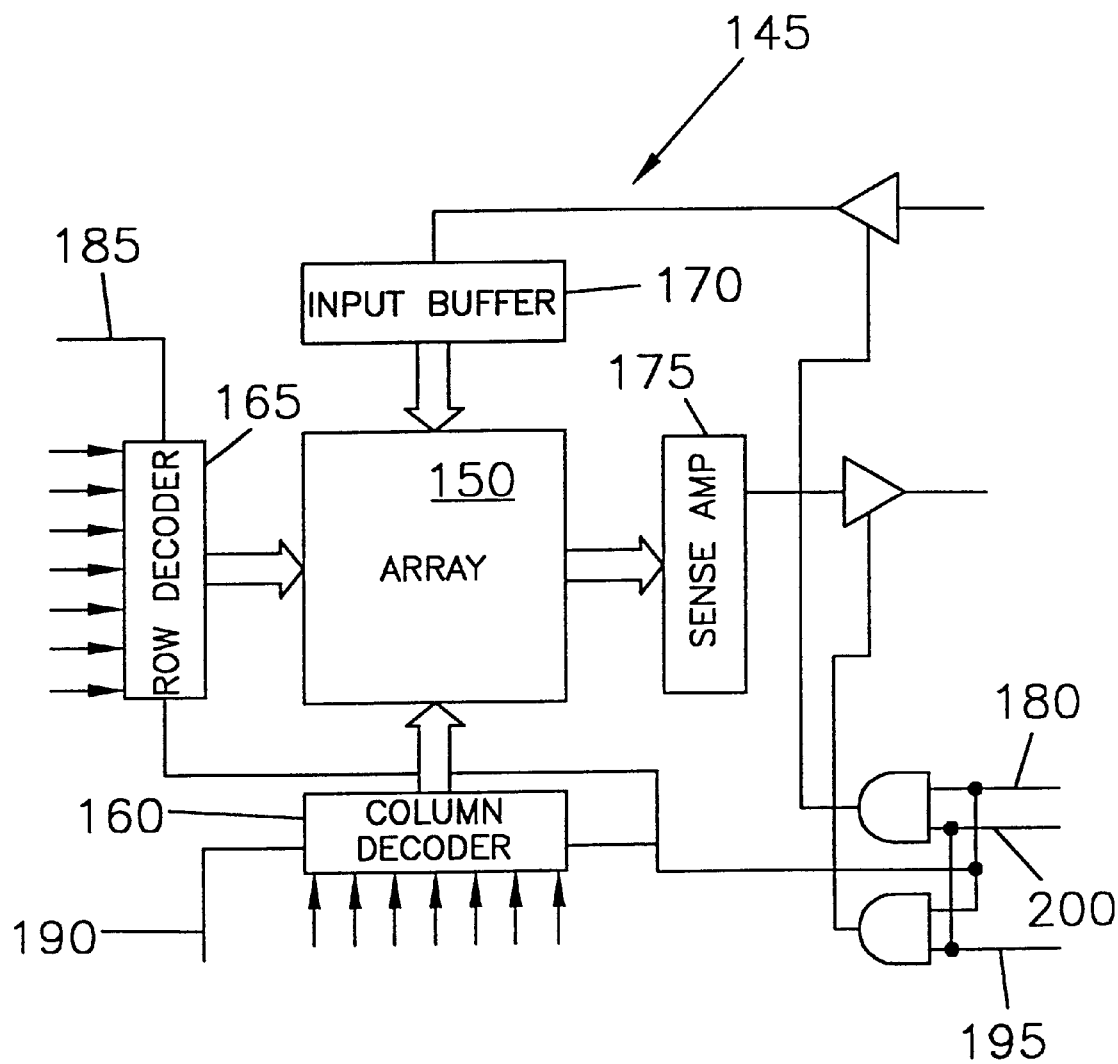
FIG. 3 is a functional block diagram of an exemplary SDRAM having an array, a row decoder, and column decoder.

Referring to FIG. 3, a SDRAM 145 typically includes an array 150 of memory cells (not shown), a column decoder 160, a row decoder 165, a data input buffer 170, and a sense amp 175. A particular SDRAM 145 in the buffer memory 125 is selected for a read or a write operation by applying a signal to a chip enable 180. An address bus (not shown) from the controller 135 is divided, with some address lines applied to the row decoder 165 and latched with a row address strobe (RAS) 185, and the rest of the lines applied to the column decoder 160 and latched with a column address strobe (CAS 190). A write enable signal 195 enables data to be written to the SDRAM 145, and a output enable 200 allows data to be read from it. In addition, the SDRAM 145 also has various other voltage inputs and/or control signals known in the art but not shown in the embodiment of FIG. 3 or described herein for the sake of simplicity of description, and so as not to obscure the invention.

Figure 4:
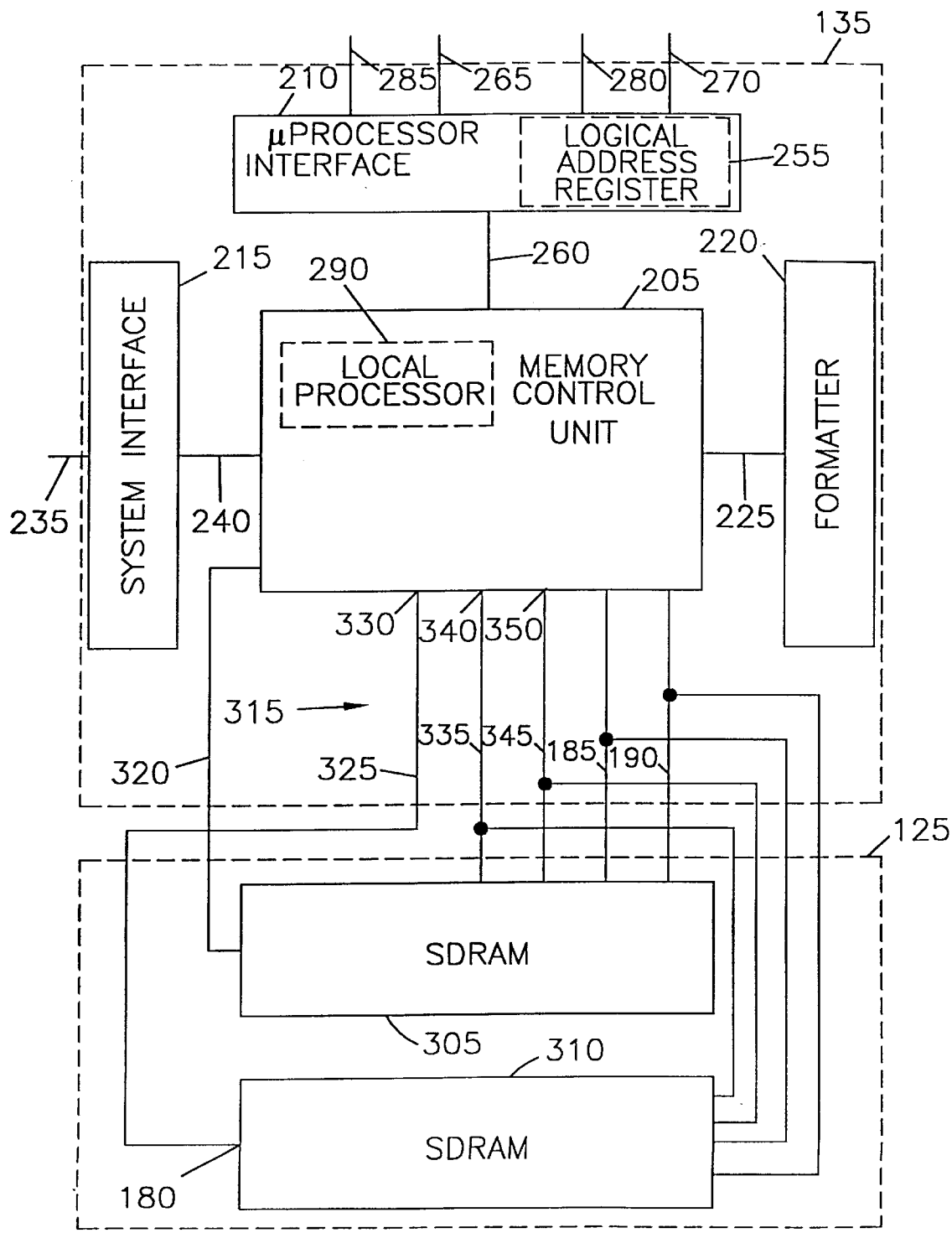
FIG. 4 is a functional block diagram of a preferred embodiment of a buffer memory system according to the present invention.

An embodiment of the present invention can be summarized with reference to FIG. 4 which is a functional block diagram of a preferred embodiment of a buffer memory system 120 according to the present invention. As shown in the diagram, the controller 135 is made up of a memory control unit (MCU) 205 connected by signal buses to various interfaces including a microprocessor interface 210, a system interface 215, and an interface to the mass storage device 105, for example a formatter 220 interface to a disc drive (not shown). The formatter 220 is connected to the mass storage device 105 by a signal bus 225 which has various signal lines that are well known in the art, and therefore are not shown in the embodiment of FIG. 4 or described herein.

The system interface 215 provides for communication between a system bus 230 in the computer 110 and the MCU 205. External signal lines to the system interface 215 include a bi-directional data bus 235 having a number of data lines (not shown), the exact number of which generally depends on the architecture of the system bus 230. For example, for communication with a system bus 230 having a Small Computer System Interface (SCSI) architecture, the data bus 235 typically has 16 input/output data lines D<15:0> to simultaneously pass 16 bits of data. The system interface 215 is coupled to the MCU 205 through a signal bus 240.

The microprocessor interface 210 generally includes a hardware and/or software protocol that translates logical block addresses (LBA) used by a central processing unit (CPU) 245 in the computer 110 for addressing data into virtual or logical addresses for use by the MCU 205. The logical addresses are stored sequentially in a logical address register 255 (shown in phantom) in the microprocessor interface 210 and coupled to the MCU 205 by a bi-directional, multiplexed address/data bus 260. By multiplexed it is meant that some or all of the lines in the bus 260 transmit data and addresses in alternate time periods. The microprocessor interface 210 is coupled to the CPU 245 by another bi-directional, multiplexed address/data bus 265. A chip-select signal on signal line 270 enables the controller 135 for either a read operation or a write operation. A read-data signal on signal line 280, in conjunction with the chip-select signal, causes data to be moved from the mass storage device 115 to the computer 110 through the MCU 205. A write data signal on signal line 285, in conjunction with the chip-select signal, causes data to be moved to the MCU 205 and to subsequently be mapped to the buffer memory 125.

The MCU 205 includes a local processor 290 (shown in phantom) having a primary cache (not shown) with an instruction register (not shown) and an accumulator (not shown) embedded therein. The MCU 205 accepts instructions and a block of data, including a logical address, from the computer 110 via the microprocessor interface 210 and the system interface 215 and stores them in the instruction register and address accumulator. The MCU 205 divides the data into blocks or paragraphs of a predetermined size, and executes a mapping program to translate the logical address to a physical address in the buffer memory 125. These paragraphs can include any number of bits of data, from a single bit to several thousand bytes depending on the architecture of the buffer memory. For example, for a 16Mbit SDRAM having an array of 4096 rows and 256 columns grouped into 16 groups of 16 columns each, the data is divided into paragraphs of 16 words of 16 bits each. One paragraph is stored in each row of a group of columns. Optionally, the MCU 205 includes a computer readable medium with a computer program product stored therein for checking the integrity of data stored and recovered from the mass storage device 115. For example, in a preferred embodiment, the MCU 205 performs a bit-wise EXCLUSIVE-OR operation on each word in a paragraph to produce a parity word for the paragraph. More preferably, to provide contiguous addressing for data stored in a single SDRAM, the parity word for a paragraph is a LRC-word stored in the same row of a LRC-area 300, which includes all rows in the last group of columns, i.e., columns 241 to 256, as described above.

Referring to FIG. 4, the MCU 205 is coupled to first and second SDRAMs 305, 310 in the buffer memory 125 through various signal lines. These signal lines include a multiplexed bi-directional address/data bus 315, a chip select line 320, and the row address strobe (RAS) 185 and column address strobe (CAS) 190 described above. The address/data bus 315 is divided into three groups of one or more lines each, and each group is connected to one of three sets of address outputs on the MCU 205. Each set of address outputs can have one or more individual address outputs. According to the present invention, a first group of signal lines 325 couples a first set of address outputs 330 to the chip enable 180 of the second SDRAM 310 and to subsequent SDRAM (not shown) if any. In the embodiment shown in FIG. 4, one output 330 coupled by one signal line 325 to the second SDRAM 310. A second group of signal lines 335 couples a second set of X address outputs 340 in parallel to the column decoders 160 of the SDRAMs 305, 310, where X is an integer representing the number of digits in a binary number equal to the number of groups of columns in the SDRAMs. A third group of Y signal lines 345 couples a third set of Y address outputs 350 in parallel to the row decoders 165, where Y is an integer representing the number of digits in a binary number equal to the number of rows in the SDRAMs 305, 310. Thus, the specific number N of total address outputs and of signal lines in the address/data bus 315 depends on the number and the capacity of SDRAMs 305, 310 in the buffer memory 125.

For example, for a buffer memory 125 having two 16Mbit SDRAMs as described above, the number of signal lines in the address/data bus 315 is equal to 21. Twelve of these signal lines 345 are used to provide a 12-digit binary number to select one of the 4096 rows. Four of the signal lines in the second group of X signal lines 335 are used to select one of the 16 groups of columns, and another 4 signal lines are used to select 1 of the 16 words within the group of columns. The remaining signal line 325, is used to couple an address output 330 to the chip enable 180 of the second SDRAM 310. This address output 330 can be any one of the address outputs from the MCU 205, and need not be multiplexed or bi-directional. In addition, the address output 330 can either couple directly to the second SDRAM 310 through signal line 325, as shown in FIG. 4, or it can couple through a memory interface (not shown).

Figure 5:
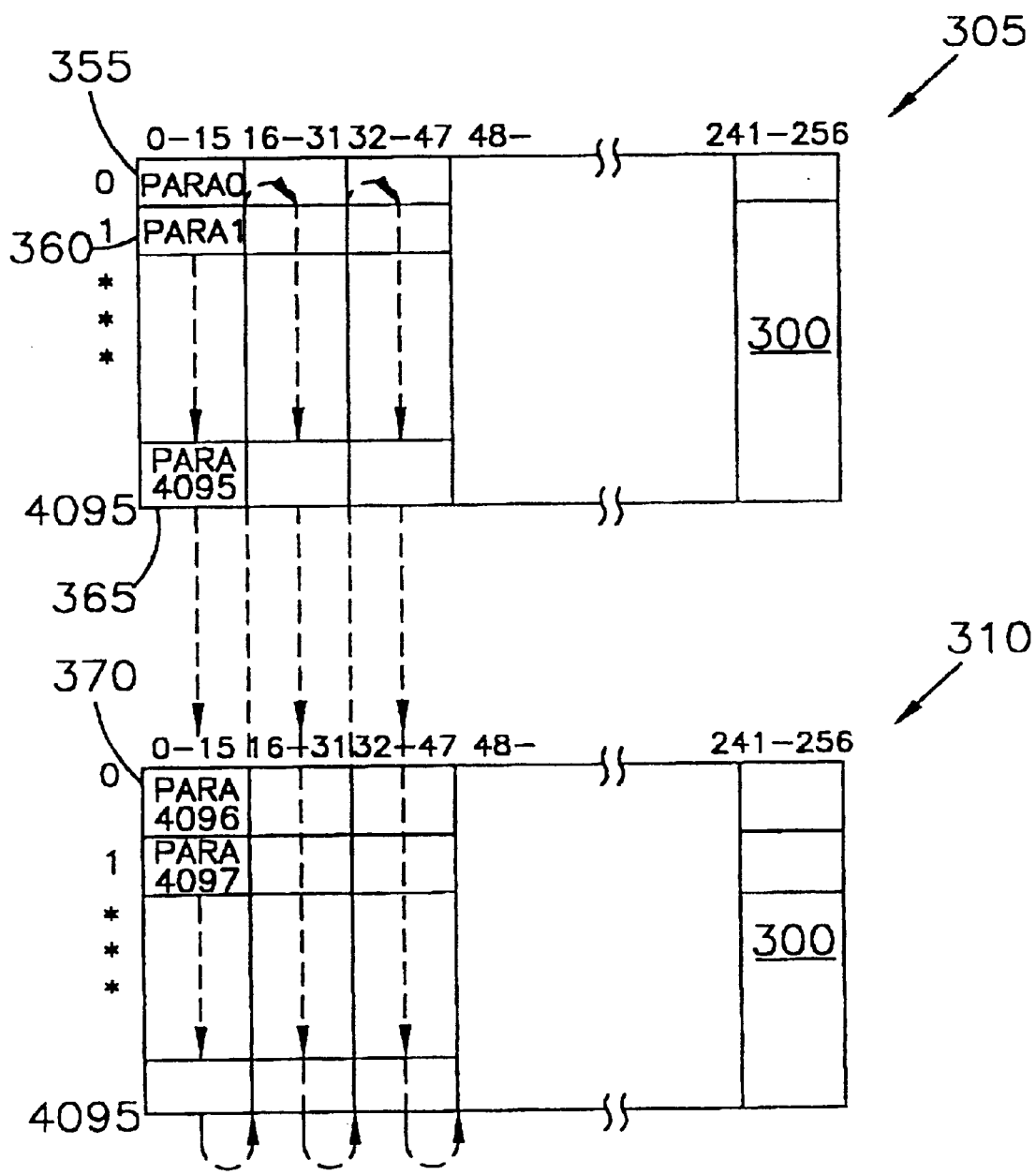
FIG. 5 is a diagram of a buffer memory of a preferred embodiment of a buffer memory system having two vertically stacked memory arrays according to the present invention.

In accordance the present invention, the MCU 205 utilizes a special mapping scheme in translating the logical addresses to the physical addresses which provides contiguous logical addresses for sequential blocks of data mapped to different SDRAMs in buffer memory 125. FIG. 5 is a diagram of an example of a preferred embodiment of a buffer memory 125 according to the present invention having two vertically stacked memory arrays. Referring to FIG. 5, for a buffer memory 125 having first and second 16Mbit SDRAMs 305, 310 as described above, a first paragraph 355, PARA 0, consisting of 16 words of 16 bits each, is stored at row 0 and columns 0 through 15 on the first SDRAM 305. The row address is incremented and a second paragraph 360, PARA 1, is stored at row 1 columns 0 to 15 of the same SDRAM, and so on. After the row limit has been reached, i.e., row 4095, a 4096$^{th}$ paragraph 365, PARA 4096, is stored in row 4095 columns 0 to 15 of the first SDRAM 305. The row address is incremented and the next paragraph 370, PARA 4097, is stored at row 0 columns 0 to 15 of the second SDRAM 310. This continues until the last row of the last SDRAM is reached, for example row 4095 of a second SDRAM 310. The column address is then incremented to the next group of columns, i.e., columns 16 to 31, and the row address loops back to the first row, row 0, of the first SDRAM 305 and continues as before. In this manner, the LRC-area 300 is effectively moved to the top or the end of a range of logical addresses, leaving a large uninterrupted block of logical addresses available for addressing data.

Figure 6:
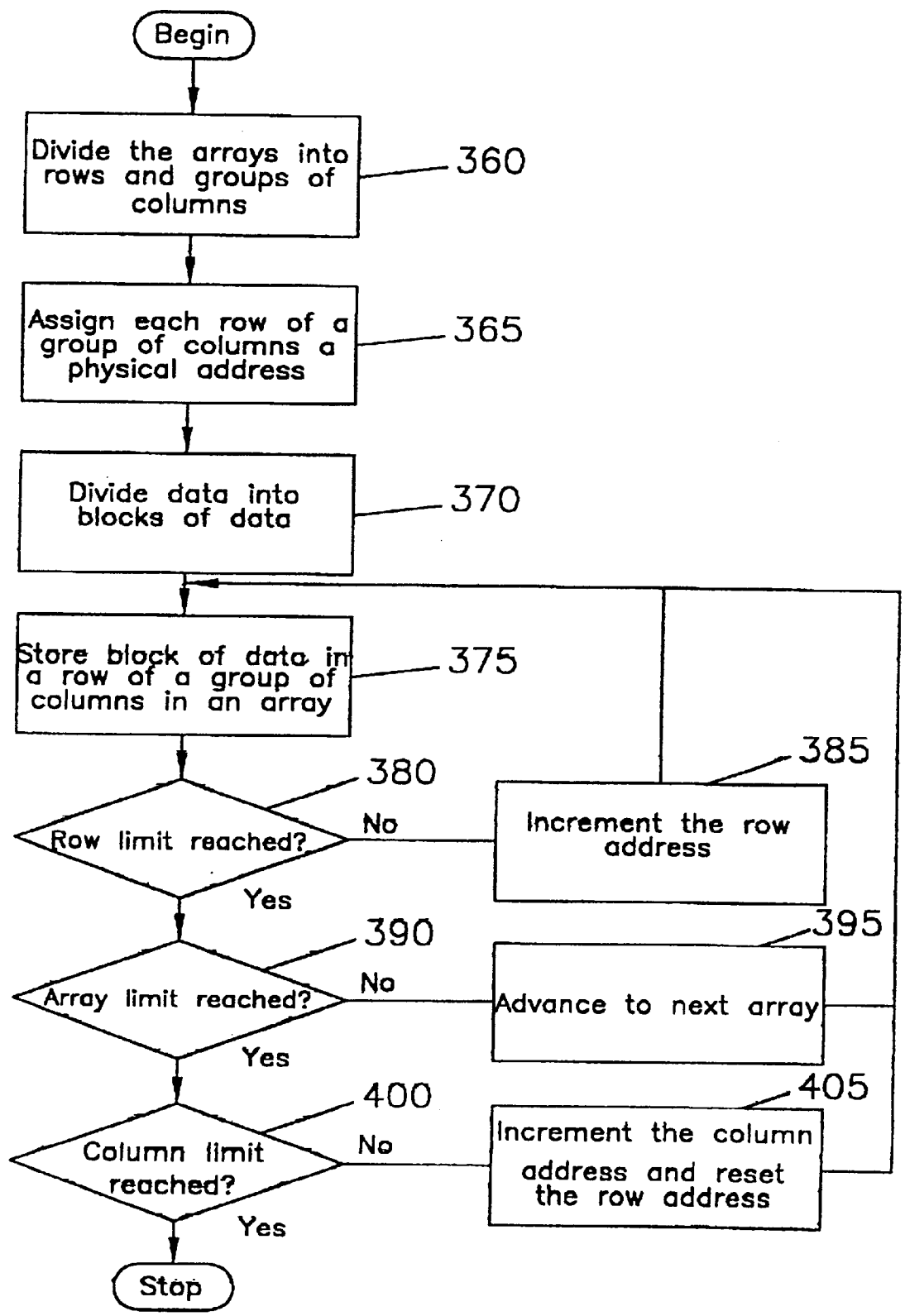
FIG. 6 is a flowchart showing the process flow of a method of operating an embodiment of a buffer memory system according to the present invention for mapping contiguous logical addresses to multiple arrays.

Steps of an exemplary process for carrying out the mapping scheme will be described with reference to FIG. 6. In a first step 360 the arrays are divided into rows and groups of columns as described above. In an addressing step 365, each row of a group of columns is assigned a physical address having a row address and a column address. The data is then divided in step 370 into blocks of a predetermined size, each block capable of being stored in a single row of a single column. In step 375, a block of data is stored in a row of a group of columns in an array. Next in a determination step 380 it is determined if a row limit has been reached, that is whether the last addressed row corresponds to the last row in the array. If the row limit has not been reached, the row address is incremented in step 385 and steps 375 and 380 repeated. If the row limit has been reached, it is determined in step 390 if an array limit has been reached, that is whether data has been stored in all rows of corresponding groups of columns in all arrays. If the array limit has not been reached the process advances to the next array in step 395 and steps 375 through 390 are repeated. If the array limit has been reached, it is determined in step 400 if a column limit has been reached, that is whether data has been stored in all groups of columns in all arrays. If the column limit has not been reached the process advances to the next group of columns in step 405 and steps 375 through 400 are repeated. If the column limit has been reached the process ends.

The above mapping scheme can be implemented in several alternative ways including a hardware protocol, a software protocol, or a hybrid hardware/software protocol. In one preferred embodiment, the controller has a hardware architecture adapted to directly map the logical addresses to physical addresses, thereby improving the speed and efficiency of the buffer memory system 120. More particularly, the address outputs 330, 340, 350 of the MCU 205 are coupled to the buffer memory 125 in such a way that providing a binary number representing a logical address on the address outputs selects the appropriate corresponding physical address. For example, data having a logical address of 0 is mapped to the first word of PARA 0 by providing binary zeros, or logical lows, to the address outputs, and data having a logical address of 65,536 is mapped to the last word of PARA 4095 by providing the binary equivalent of 65,536, i.e., binary "1111111111111111" to address outputs.

To illustrate the above direct mapping method, the connections necessary for a buffer memory system 120 having two 16Mbit SDRAMs will now be described. A 16Mbit SDRAM has an array of 4096 rows and 256 columns grouped into 16 groups of 16 columns each. Thus, a buffer memory system 120 having two 16Mbit SDRAMs according to the present invention requires a MCU 205 having 21 address outputs numbered from A20 to A0 (hereinafter A<20:0>) connected as follows. Address outputs A<3:0> are coupled in parallel to the four least significant bits (LSB) of the column decoders 160, C<3:0>, to select 1 of the 16 words within a group of columns. Address outputs A<15:4> are coupled to the row decoders 165, R<11:0> of the SDRAMs 305, 310, to select 1 of the 4096 rows in a SDRAM. The next most significant bit (MSB) of the address outputs, A16, is coupled to the chip enable 180 of the second SDRAM 310 to select the second SDRAM 310. Address outputs A<22:19> are coupled to the four MSBs of the column decoders 160, C<7:4> of the SDRAMs 305, 310, to select 1 of the 16 groups of columns.

A write operation will now be described with reference to FIG. 5 to illustrate how the above exemplary architecture achieves the mapping scheme of the present invention. A first word in a first paragraph (PARA 0), having a logical address of 0, is mapped to buffer memory 125 by providing binary zeros, or logical lows, to all address outputs A<20:0> to select row 0 column 0 of the first SDRAM 240. The row and column addresses are then latched by applying a RAS 185 and CAS 190, and 16 bits of data written to the first SDRAM 305 through the multiplexed address outputs. The next word, having a logical address of 1, is mapped to buffer memory 125 by providing the binary equivalent of 1, i.e., 0001, to address outputs A<3:0> to select column 1. This continues until the last word in PARA 0, having a logical address of 15, is mapped to buffer memory 125 by providing the binary equivalent of 15, i.e., 1111, to address outputs A<3:0>, to select column 15. Incrementing the logical address by 1 provides 10000 to address outputs A<4:0> to select the first word of the second paragraph (PARA 1). This continues until the last word in the last paragraph (PARA 4095), having a logical address of 65,536, has been written to column 15, row 4095 on the first SDRAM 305 by providing the binary number "1111111111111111" on address outputs A<15:0>. The next sequential logical address, 65,537, provides all zeros to address outputs A<15:0>, and a 1 on address output A16 to select the first word of the first paragraph (PARA 4096 ) on the second SDRAM 310. The mapping then continues as before until the last word in the last paragraph (PARA 8091), which has a logical address of 131,071, has been written by providing the binary number "11111111111111111" on address outputs A<16:0>. Incrementing the logical address by 1, logical address of 131,072, provides all zeros to address outputs A<16:0>, and a 1 on address output A17 causing the physical address to loop back to the first word of the first paragraph (PARA 8092) in columns 16 to 31 on the first SDRAM 305.

Optionally, the controller 135 includes an additional circuit (not shown) having separate connections to the MCU 205 to map LRC-words to physical addresses within the LRC area 300 of the SDRAMs 305, 310. Generally, this is accomplished by applying the appropriate signal to the four MSBs of the column decoder 160 to select the last group of columns, selecting the row on one of the SDRAMs by coupling the appropriate address outputs from the MCU 205 to the row decoder 165 and the chip enable 180, and coupling the next four most significant outputs to the four LSBs of the column decoder to select the column. For example, for a buffer memory 125 having a pair of 16Mbit SDRAMs 305, 310 as described above the circuit is connected as follows. First, the binary equivalent of 16 is applied to the four MSBs of the column decoders 160 C<7:4> to select the last group of columns in the SDRAMs 305, 310, i.e., columns 241 to 256. Next, address outputs A<15:4> are coupled to the row decoder 165 and address output A16 is coupled to the chip enable 180 of the second SDRAM 310, as described above, to select in the same row as that of the paragraph for which the LRC-word was generated. Finally, address outputs A<20:17>, which were used above select the group of columns, are coupled to the four LSBs of the column decoders 160 C<3:0> to select the appropriate column within the last group of columns in which to store the LRC-word. Alternatively, this parity mapping can be accomplished using a software protocol which transforms the address outputs of the MCU 205 internally. That is the output of address outputs A<3:0> and A<20:17> are switched, and then 1111 is output on A<20:17>.

As is readily apparent to one skilled in the art in light of the description provided herein, the above scheme can be adapted to buffer memory systems 120 having SDRAMs of other sizes. For example, a 64Mbit SDRAM has an array of 8192 rows and 256 columns grouped into 16 groups of 16 columns each. Thus, a buffer memory system 120 having two 64Mbit SDRAMs according to the present invention requires a MCU 205 having 23 address outputs A<22:0>, coupled as follows. Address outputs A<3:0> are coupled to the four LSBs of the column decoders 160, C<3:0>, to select 1 of the 16 words within a group of columns. Address outputs A<22:19> are coupled to the four MSBs of the column decoders 160, C<7:4>, to select 1 of the 16 groups of columns. Address outputs A<17:4> are coupled to the row decoders 165, R<13:0> to select 1 of the 16384 rows. Address output A18 is coupled to the chip enable 180 a second SDRAM 310 to enable the second SDRAM 310 when the row address is greater than 8091. Similarly, a buffer memory system 120 having two 4Mbit SDRAMs requires a MCU 205 having 19 address outputs, A<18:0>. Address outputs A<18:15> and A<3:0> are coupled to the column decoders 160 to select the group of columns and the word within the group respectively, and address outputs A<13:4> are coupled to the row decoders 165 to select 1 of 1024 rows. Address output A14 is coupled to the chip enable 180 the second SDRAM 310 to enable the second SDRAM 310 when the row address is greater than 1023.

In another embodiment, not shown, the buffer memory system 120 of can expanded to include additional SDRAM, and is limited only by the number of address outputs available from the MCU 205 and by the ability of output drivers of the MCU to keep up with the loading imposed by multiple SDRAMs connected in parallel to the RAS 185, CAS 190, and the address/data bus 315. The mapping for this expanded buffer memory system 120 can be achieved using a hardware or software protocol, and any otherwise unused address output. Consequently, the structure and method are applicable to any number of memory devices, including a plurality of RAM chips.

The present buffer memory method and system have several advantage over conventional designs. One of the advantage of the present buffer memory method and system is that it provides a higher capacity buffer memory 125 and a scheme for ensuring data integrity which, because of the contiguous logical addresses for sequential blocks of data stored within a single SDRAM and in different SDRAMs, allows data to be accessed quickly. Moreover, by eliminating the need to skip logical addresses between sequential blocks of data, the present invention also reduces command overhead, increasing the bandwidth of the buffer memory system 120 and simplifying the operation of the CPU 245.

Aspects of some embodiments of the invention will now be set forth by way of review. The present invention relates to a memory system 120 and a manner of operating the system that solves these problems. The memory system 120 includes several arrays 150 arranged in groups of columns having a column address, and rows having a row address. The manner of operating the system 120 involves storing blocks of data in the arrays 150 in a way that provides contiguous logical addresses for the blocks of data. A block of data is stored in a row of a group of columns in an array 150. Next the row address is incremented and the process repeated until a row limit is reached. After the row limit has been reached, the process is repeated with another array 150 until blocks of data have been stored in all rows of a corresponding group of columns in the array 150. The column address is incremented and the row address reset, and the process repeated until a column limit is reached. Preferably, the manner of operating the system 120 also includes generating a parity word for each block of data to check the integrity of data recovered from the arrays. More preferably, the procedure includes reserving all rows in a last group of columns in an array for parity words generated for blocks of data stored in the array 150, thereby shifting the logical addresses associated with the physical addresses of the parity words to a top end of the range of logical addresses. The step of generating a parity word can include performing a bit-wise EXCLUSIVE-OR on each block of data to generate a longitudinal redundancy code word.

In one embodiment, the invention is directed to a manner of operating a disc drive (not shown) having a buffer memory system 120 including several arrays 150 capable of storing data. The arrays 150 are divided into rows and groups of columns, each row of a group of columns having a physical address. The data is divided into blocks of a predetermined size, the physical addresses of the rows and groups of columns are associated with logical addresses so that (i) a first block of data is stored in a last row of a group of columns in a first array 150, and (ii) a second block of data having a logical address contiguous to that of the first block of data is stored in a first row of a corresponding group of columns in a second array 150. Optionally, a third block of data is stored in a last row of the corresponding group of columns in the second array 150, and storing a fourth block of data having a logical address contiguous to that of the third block of data in a first row of a second group of columns of the first array 150.

In another aspect, the present invention is directed to a memory system 120 having several arrays 150 capable of storing data. Each of the arrays are divided into cells (not shown) identified by a range of physical addresses. A controller 135 associates logical addresses with the physical addresses and accesses the cells. The controller 135 is adapted to associate physical addresses for cells in different arrays 150 with contiguous logical addresses. Preferably, the controller 135 includes several outputs 330, 340 and 350, each of which represent one bit of a binary number. More preferably, the arrays 150 include several random access memories 145, and the outputs 330, 340 and 350, are coupled to the arrays 150 so that furnishing a binary number representing a logical address on the outputs accesses a cell having the corresponding physical address. In one embodiment, the arrays 150 have rows and groups of columns, and the outputs 330, 340 and 350 are divided into sets of outputs including a first set 330 of at least one output coupled to a chip enable 180 on one of the random access memories 145 for selecting the random access memories. Preferably, the outputs include a second set of X outputs 340 for selecting a group of columns, and a third set of Y outputs 350 for selecting a row. More preferably, the first set of outputs 330 includes an outlet representing a next most significant bit of the binary number after that represented by the third set of outputs 350. The controller 135 can also include a computer readable medium (not shown) with a computer program product (not shown) stored therein for checking integrity of data stored in the arrays 150.

In yet another aspect, the present invention is directed to a data storage system 130 having a data storage device 115 for storing data, and several arrays 150 capable of temporarily storing data for the data storage device. Each of the arrays 150 are divided into cells identified by a range of physical addresses. A controller 135 associates logical addresses with the physical addresses and accesses the cells. The controller 135 is adapted to associate physical addresses for cells in different arrays 150 with contiguous logical addresses. The data storage device 115 can be a magnetic disc drive (not shown), an optical disc drive (not shown), or a magneto-optical disc drive (not shown).

In still another aspect, the present invention is directed to a data storage system 130 having several arrays 150 divided into cells identified by a range of physical addresses and a means for associating logical addresses with the physical addresses of the cells, the means adapted to associate physical addresses for cells in different arrays with contiguous logical addresses. Optionally, the means for associating the logical addresses with the physical addresses is further adapted to access the cells. Preferably, the means for associating the logical addresses with the physical addresses includes a controller 135. More preferably, the controller 135 has several outputs 330, 340, and 350, each output representing one bit of a binary number, and the outputs are coupled to the arrays 150 so that providing a binary number representing a logical address on the outputs accesses the cell having the physical address associated with the logical address.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, although the preferred embodiment described herein is directed to a buffer memory system for a mass storage device, it will be appreciated by those skilled in the art that the teachings of the present invention can be applied to couple a computer to other peripheral devices such as a printer, a modem, a network adapter or a video interface, without departing from the scope and spirit of the present invention.

What is claimed is:

1. A method of storing blocks of data having contiguous logical addresses in a plurality of arrays, the arrays arranged in rows and groups of columns, the rows having a row address and the groups of columns having a column address, the method comprising steps of:
   (a) storing a block of data in a row of a group of columns in an array;
   (b) incrementing the row address and repeating step (a) until a row limit is reached;
   (c) advancing to a next array and repeating step (a) and (b) until blocks of data have been stored in rows of corresponding groups of columns in the plurality of arrays;
   (d) incrementing the column address and resetting the row address; and
   (e) repeating steps (a) through (c) until a column limit is reached.

2. A method according to claim 1 comprising a further step of generating a parity word for each block of data to check the integrity of data subsequently recovered from the plurality of arrays.

3. A method according to claim 2 comprising a further step of reserving all rows in a last group of columns in an array for parity words generated for blocks of data stored in the array, whereby the parity words have logical addresses at a end of a range of logical addresses.

4. A method of operating a disc drive having a buffer memory system comprising a plurality of arrays capable of storing data, the method comprising steps of:
   (a) dividing the arrays into rows and groups of columns, each row of a group of columns having a physical address;
   (b) dividing data into blocks of a predetermined size, each block of data capable of being stored in a row of a group of columns; and
   (c) associating the physical addresses of the rows and groups of columns with logical addresses so that:
      (i) a first block of data is stored in a last row of a group of columns in a first array; and
      (ii) a second block of data having a logical address contiguous to that of the first block of data is stored in a first row of a corresponding group of columns in a second array.

5. A method according to claim 4 wherein step (c) comprises the further steps of:
   (c)(iii) storing a third block of data in a last row of the corresponding group of columns in the second array; and
   (c)(iv) storing a fourth block of data having a logical address contiguous to that of the third block of data in a first row of a second group of columns of the first array.

6. A method according to claim 4 comprising a further step of generating a parity word for each block of data.

7. A method according to claim 6 comprising a further step of reserving all rows in a last group of columns in an array for parity words generated for blocks of data stored in the array, whereby the parity words have physical addresses associated with logical addresses at a top end of the range of logical addresses.

8. A memory system comprising:
  (a) a plurality of arrays capable of storing blocks of data, each of the arrays divided into rows and groups of columns to form cells having a range of physical addresses to identify the cells, each of the physical addresses comprising a row address and a column address; and
  (b) a controller configured to associate logical addresses with the physical addresses and access the cells, the controller further configured to:
    (i) store a block of data in a row of a group of columns in an array;
    (ii) increment the row address and repeat step (i) until a row limit is reached;
    (iii) advance to another of the plurality of arrays and repeat step (i) and (ii) until blocks of data have been stored in all rows of a corresponding group of columns;
    (iv) repeat steps (i) through (iii) until blocks of data have been stored in all rows of corresponding groups of columns in the plurality of arrays;
    (v) increment the column address and reset the row address; and
    (vi) repeat steps (i) through (v) until a column limit is reached.

9. A memory system according to claim 8 wherein the controller comprises a plurality of outputs, each output representing one bit of a binary number, and wherein the outputs are coupled to the plurality of arrays so that providing a binary number representing a logical address on the plurality of outputs accesses the cell having the physical address associated with the logical address.

10. A memory system according to claim 9 wherein the plurality of arrays comprise a plurality of random access memories, and wherein at least one of the plurality of outputs is coupled to a chip enable on one of the random access memories.

11. A memory system according to claim 9 wherein the arrays comprise rows and groups of columns, and wherein the plurality of outputs are divided into sets of outputs including a first set of at least one output for selecting one of the plurality of arrays, a second set of X outputs for selecting a group of columns, and a third set of Y outputs for selecting a row.

12. A memory system according to 11 wherein the first set of outputs comprises an outlet representing a next most significant bit of the binary number after that represented by the third set of outputs.

13. A memory system according to claim 8 wherein the controller comprises a computer readable medium with a computer program product stored therein for checking integrity of data stored in the arrays.

14. A data storage system comprising:
  (a) a data storage device for storing data;
  (b) a plurality of arrays capable of temporarily storing blocks of data for the data storage device, each of the arrays divided into rows and groups of columns to form cells having a range of physical addresses to identify the cells, each of the physical addresses comprising a row address and a column address; and
  (c) a controller configured to associate logical addresses with the physical addresses and access the cells, the controller further configured to:
    (i) store a block of data in a row of a group of columns in an array;
    (ii) increment the row address and repeat step (i) until a row limit is reached;
    (iii) advance to another of the plurality of arrays and repeat step (i) and (ii) until blocks of data have been stored in all rows of a corresponding group of columns;
    (iv) repeat steps (i) through (iii) until blocks of data have been stored in all rows of corresponding groups of columns in the plurality of arrays;
    (v) increment the column address and reset the row address; and
    (vi) repeat steps (i) through (v) until a column limit is reached.

15. A data storage system according to claim 14 wherein the controller comprises a plurality of outputs, each output representing one bit of a binary number, and wherein the outputs are coupled to the plurality of arrays so that providing a binary number representing a logical address on the plurality of outputs accesses the cell having the physical address associated with the logical address.

16. A data storage system according to claim 15 wherein the plurality of arrays comprise a plurality of random access memories, and wherein at least one of the plurality of outputs is coupled to a chip enable on one of the random access memories.

17. A data storage system according to claim 14 wherein the data storage device is selected from a group consisting of magnetic disc drives, optical disc drives, and magneto-optical disc drives.

18. A memory system comprising:
  (a) a plurality of arrays capable of storing blocks of data having logical addresses, each of the arrays divided into cells and having a range of physical addresses to identify the cells; and
  (b) means for associating the logical addresses with the physical addresses of the cells and accessing the cells, the means adapted to associate physical addresses for cells in different arrays with contiguous logical addresses.

19. A memory system according to claim 18 wherein the means for associating the logical addresses with the physical addresses comprises a controller.

20. A memory system according to claim 19 wherein the controller has a plurality of outputs, each output representing one bit of a binary number, and wherein the outputs are coupled to the plurality of arrays so that providing a binary number representing a logical address on the plurality of outputs accesses the cell having the physical address associated with the logical address.

* * * * *